(12) United States Patent
Shono et al.

(10) Patent No.: US 12,385,126 B2
(45) Date of Patent: Aug. 12, 2025

(54) SPUTTERING TARGET, METHOD FOR PRODUCING SAME, AND METHOD FOR PRODUCING SPUTTERING FILM USING SPUTTERING TARGET

(71) Applicants: TOSOH CORPORATION, Shunan (JP); TOSOH SPECIALITY MATERIALS CORPORATION, Yamagata (JP)

(72) Inventors: Daiki Shono, Ayase (JP); Taiga Kondo, Ayase (JP); Masami Mesuda, Ayase (JP); Kenichi Itoh, Yamagata (JP); Koichi Hanawa, Yamagata (JP)

(73) Assignees: TOSOH CORPORATION, Yamaguchi (JP); TOSOH SPECIALITY MATERIALS CORPORATION, Yamagata (JP)

( * ) Notice: Subject to any disclaimer, the term of this patent is extended or adjusted under 35 U.S.C. 154(b) by 0 days.

(21) Appl. No.: 18/698,353

(22) PCT Filed: Oct. 5, 2022

(86) PCT No.: PCT/JP2022/037346
§ 371 (c)(1),
(2) Date: Apr. 3, 2024

(87) PCT Pub. No.: WO2023/058698
PCT Pub. Date: Apr. 13, 2023

(65) Prior Publication Data
US 2024/0410049 A1    Dec. 12, 2024

(30) Foreign Application Priority Data

Oct. 7, 2021 (JP) .................. 2021-165421

(51) Int. Cl.
*C23C 14/34* (2006.01)
*H01J 37/34* (2006.01)

(52) U.S. Cl.
CPC ...... *C23C 14/3414* (2013.01); *H01J 37/3426* (2013.01)

(58) Field of Classification Search
None
See application file for complete search history.

(56) References Cited

U.S. PATENT DOCUMENTS

2003/0196890 A1*  10/2003  Le ................. C23C 14/564
                                                 204/192.12
2004/0072009 A1*   4/2004  Segal ................. C22F 1/08
                                                      428/561

FOREIGN PATENT DOCUMENTS

| JP | H08269700 A | 10/1996 |
| JP | 2000-234167 A | 8/2000 |
| JP | 2011132563 A | 7/2011 |
| JP | 2015196885 A | 11/2015 |
| WO | 2009107763 A1 | 9/2009 |

OTHER PUBLICATIONS

International Preliminary Report on Patentability in PCT/JP2022/037346, mailed on Apr. 18, 2024. 5pp.

* cited by examiner

*Primary Examiner* — Jason Berman
(74) *Attorney, Agent, or Firm* — HAUPTMAN HAM, LLP

(57) ABSTRACT

A sputtering target includes crystal grains, has a content of an amorphous phase of 3% by volume or less, and contains at least one metal selected from the group consisting of chromium, molybdenum, and chromium-molybdenum alloys.

16 Claims, 5 Drawing Sheets

SPUTTERING TARGET, METHOD FOR PRODUCING SAME, AND METHOD FOR PRODUCING SPUTTERING FILM USING SPUTTERING TARGET

RELATED APPLICATIONS

The present application is a National Phase of International Application No. PCT/JP2022/037346 filed Oct. 5, 2022, which claims priority to Japanese Application No. 2021-165421, filed Oct. 7, 2021.

TECHNICAL FIELD

The present disclosure relates to a sputtering target, a method for producing the same, and a method for producing a sputtering film using the sputtering target.

BACKGROUND ART

Sputtering targets (hereinafter also referred to as "targets") containing metals such as chromium and molybdenum are used for, for example, depositing light-shielding films for lithography masks. With the progress of lithographic technologies, characteristics required for the targets have also become higher, and currently, there has been a demand for a target that can further reduce the generation of impurity particles (so-called particles) of a metal oxide or the like during deposition of a sputtering film.

As the oxygen content in a target increases, the amount of particles generated increases. In addition, the crystal grain size of the target also significantly affects the amount of particles generated. Specifically, if the target has a large crystal grain size, irregularities, which may cause, for example, arcing, are formed on the surface of the target, and the amount of particles generated consequently increases.

In order to reduce the amount of particles generated, a reduction in the oxygen content and a reduction in the crystal grain size of targets have hitherto been studied. For example, PTL 1 discloses that an ingot of chromium metal is subjected to plastic working followed by recrystallization to thereby produce a target having a fine crystal grain size. PTL 2 discloses a target having a reduced oxygen content.

CITATION LIST

Patent Literature

PTL 1: Japanese Unexamined Patent Publication No. H8-269700
PTL 2: Japanese Unexamined Patent Publication No. 2015-196885

SUMMARY OF INVENTION

Technical Problem

However, in PTL 1, although a target having a fine crystal grain size is obtained, a target having a low oxygen content is not obtained. In PTL 2, although the oxygen content of the target is low, the crystal grain size of the target is not disclosed. Such a target having a low oxygen content tends to have a large crystal grain size. Thus, a target that combines a fine crystal grain size and a low oxygen content has not been available to date.

An object of the present disclosure is to provide a sputtering target whose crystal grains can be refined even with a low oxygen content, a method for producing the same, and a method for producing a sputtering film using the sputtering target.

Solution to Problem

Specifically, the present invention is defined in the claims, and the gist of the present disclosure is as follows.
(1) A sputtering target including crystal grains, in which the sputtering target has a content of an amorphous phase of 3% by volume or less and contains at least one metal selected from the group consisting of chromium, molybdenum, and chromium-molybdenum alloys.
(2) The sputtering target according to (1), in which an oxygen content is 100 mass ppm or less, and an average crystal grain size of the crystal grains is 150 μm or less.
(3) The sputtering target according to (2), in which a maximum deviation of the average crystal grain size of the crystal grains in a depth direction is 30 μm or less.
(4) The sputtering target according to any of (1) to (3), in which a crystal orientation of the crystal grains is a random orientation.
(5) The sputtering target according to any of (1) to (4), in which a sputtering surface has an area of 200 $cm^2$ or more.
(6) The sputtering target according to any of (1) to (5), in which an average KAM value is 2° or less.
(7) The sputtering target according to any of (1) to (6), in which a relative density exceeds 99.6%.
(8) The sputtering target according to any of (1) to (7), in which the crystal grains have an average aspect ratio of 1 or more and 1.8 or less.
(9) A method for producing a sputtering film, the method including performing sputtering using the sputtering target according to any of (1) to (8) to produce a sputtering film.
(10) A method for producing the sputtering target according to any of (1) to (8), the method including a refining step including a plastic working step of subjecting an ingot containing at least one metal selected from the group consisting of chromium, molybdenum, and chromium-molybdenum alloys to plastic working treatment to obtain a plastically worked product and a heat treatment step of subjecting the plastically worked product to heating treatment.
(11) The method for producing the sputtering target according to (10), in which the refining step is repeated.

Advantageous Effects of Invention

An object of the present disclosure is to provide at least one of a sputtering target whose crystal grains can be refined even with a low oxygen content, a method for producing the same, and a method for producing a sputtering film using the sputtering target.

DESCRIPTION OF EMBODIMENTS

Figure 1:
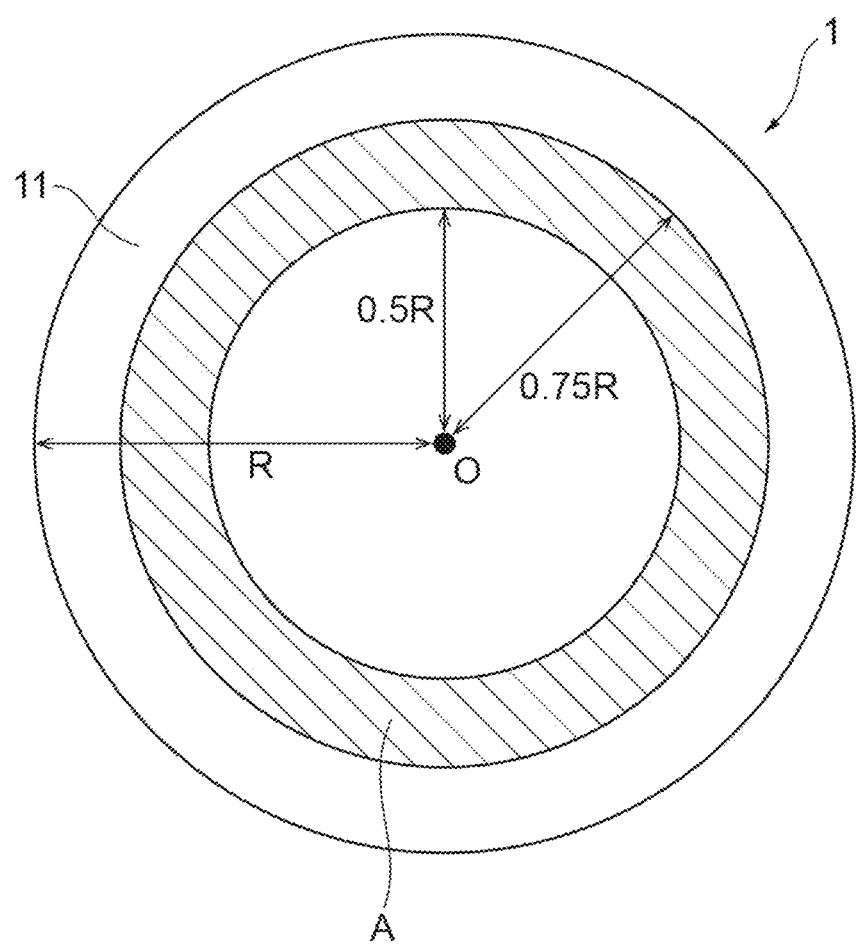
FIG. 1 is a schematic top view of a target for illustrating an observation region A.

The present disclosure will be described in detail with reference to an embodiment; however, the present disclosure is not limited to the following embodiment.

<Sputtering Target>

A target of the present embodiment is a sputtering target containing at least one metal selected from the group consisting of chromium, molybdenum, and chromium-molybdenum alloys. The target of the present embodiment is more preferably a sputtering target containing at least one of chromium and molybdenum, still more preferably a sputtering target containing chromium. Moreover, the target of the present embodiment is a metal sputtering target and may be a metal sputtering target made of chromium, molybdenum, or a chromium-molybdenum alloy, a metal sputtering target made of at least one of chromium or molybdenum, or a metal sputtering target made of chromium.

The oxygen content of the target of the present embodiment is preferably 100 mass ppm or less, more preferably 30 mass ppm or less, still more preferably 20 mass ppm or less, still further more preferably 10 mass ppm or less, particularly preferably 7 mass ppm or less. When the oxygen content of the target is within the above range, incorporation of oxygen in a film can be reduced during film deposition to suppress the generation of particles caused by incorporation of oxygen. Furthermore, the target of the present embodiment can provide a sputtering film having higher crystallinity.

The oxygen content of the target can be measured with an oxygen/nitrogen analyzer (apparatus name: ON736, manufactured by LECO Corporation).

The average crystal grain size (average grain size) of crystal grains of the target of the present embodiment is preferably 150 μm or less, more preferably 120 μm or less, 100 μm or less, 80 μm or less, 60 μm or less, or 40 μm or less. The average crystal grain size may be 1 μm or more, 10 μm or more, 20 μm or more, or 25 μm or more. When the average crystal grain size is within this range (that is, 1 μm or more and 150 μm or less), the generation of particles during film deposition is reduced, and detachment of redeposited sputtered particles can also be suppressed while abnormal electrical discharge is suppressed.

The average crystal grain size can be determined by a method based on the intercept method described in appendix C of JIS G 0551:2013 and is a value determined from the average line segment length per one crystal grain of a line segment crossing crystal grains that constitute a target while the microstructure of the target is observed. The method for observing the microstructure of a target may be, for example, an observation method using an optical microscope or an electron microscope.

Figure 2:
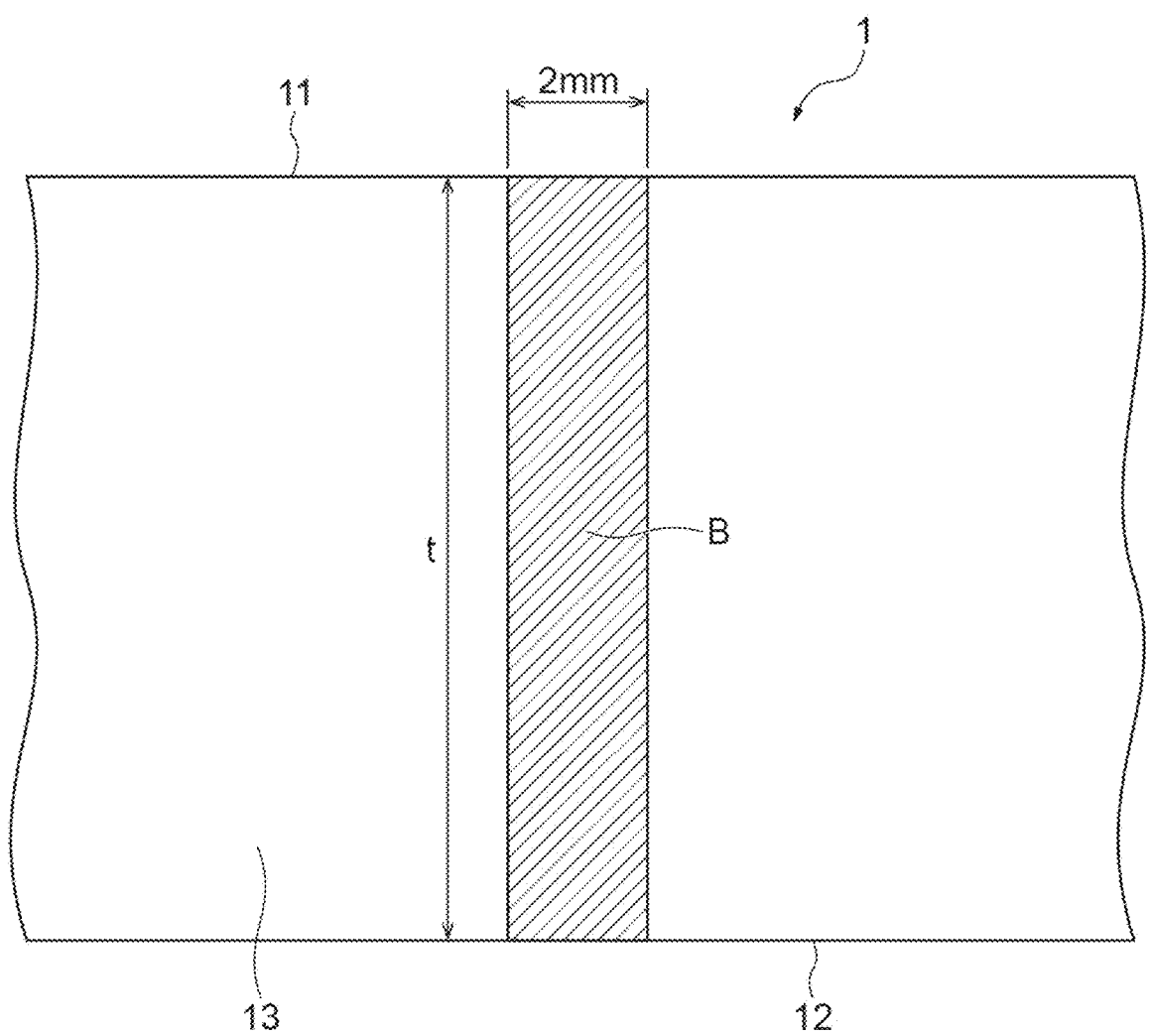
FIG. 2 is a schematic cross sectional view of a target for illustrating a measurement portion B.

FIGS. 1 and 2 are schematic views of a target. FIG. 1 is a schematic top view of the target for illustrating an observation region A, and FIG. 2 is a schematic sectional view of the target for illustrating a measurement portion B. The shape of the target is not particularly limited; however, in FIGS. 1 and 2, the description will be made on the assumption that the target has a disk shape. In FIG. 2, a sputtering surface 11 is a surface facing an object onto which a film is to be formed, such as a substrate, during film deposition and is a surface that comes in contact with an atmosphere gas converted into plasma. In contrast, a bonding surface 12 is a surface to be joined to a backing plate. As illustrated in FIG. 2, the sputtering surface 11 and the bonding surface 12 each correspond to a flat surface of the disk (hereinafter, the sputtering surface is also referred to as a "front surface", and the bonding surface is also referred to as a "back surface" for the sake of convenience).

As illustrated in FIG. 1, an annular region on a circular sputtering surface 11 of a target 1 is defined as an observation region A. When the distance from a center O of the circle to the outer circumference thereof (the radius of the circular sputtering surface 11) is denoted by R, the observation region A is a region located between a circle centered on O and having a radius of 0.5R and a circle centered on O and having a radius of 0.75R. In the case where the sputtering surface of the target has a rectangular shape, when the distance from an intersection P of the diagonal lines to a point Q on the outer periphery of the rectangle is denoted by PQ, the observation region A is a region located between a rectangle in which the distance from P, which is the intersection of the diagonal lines, to the outer periphery is 0.5PQ and a rectangle in which the distance from P, which is the intersection of the diagonal lines, to the outer periphery is 0.75PQ. In a cross section 13 of the observation region A, a region of 2 mm in width×t (mm) in overall thickness is defined as a measurement portion B (see FIG. 2), and the average crystal grain size in the measurement portion B can be measured by scanning electron microscope-electron backscatter diffraction (hereinafter also referred to as "SEM-EBSD"). Measurement conditions and programs used for SEM-EBSD are as follows.

(Measurement Conditions)
  Beam conditions: Accelerating voltage 20 kV, Illumination current 100 μA
  Work distance: 10 mm
  Step width: 5 μm
(Programs Used)
  Measurement program: AZtec
  Analysis program: AZtec Crystal The cross section of the target used as a sample may be exposed by cutting the target using a common cutting method (which may be, for example, a cutting method with at least one of a fine cutter and a water jet). Prior to the measurement, the sample (specifically, the cross section of the target used as the sample) may be pretreated by being mirror-polished with SiC abrasive paper and by buffing, followed by electrolytic etching with a 5 vol % aqueous solution of sulfuric acid.

The average aspect ratio of crystal grains is not particularly limited but is preferably 1 or more and 1.8 or less, more preferably 1 or more and 1.6 or less, particularly preferably 1 or more and 1.4 or less.

When the average aspect ratio of crystal grains is 1 or more, irregularities on the surface of the target during film deposition can be reduced to thereby reduce particles. On the other hand, when the average aspect ratio of crystal grains is 1.8 or less, the strength of the crystal microstructure in the in-plane direction can be increased to thereby reduce the cracking of the target during film deposition.

The content of an amorphous phase (hereinafter also referred to as an "amorphous phase fraction") of the target of the present embodiment is 3% by volume or less, preferably 1% by volume or less, more preferably 0.5% by volume or less, particularly preferably 0.3% by volume or less. When the amorphous phase fraction is 3% by volume or less, the generation of particles due to an increase in the surface roughness of the target during film deposition can be suppressed. The amorphous phase fraction may be, for example, 0.01% by volume or more, or 0.1% by volume or more.

The amorphous phase fraction can be measured by the following method. Specifically, for the measurement portion B in the observation region A, the microstructure of the target is observed by SEM-EBSD under the conditions (measurement conditions) described above, and the KAM (Kernel Average Misorientation) values at all measurement points are then measured.

The amorphous phase fraction is calculated by dividing the number of measurement points at which the KAM value is 1° or more by the number of all measurement points. That is, the amorphous phase fraction can be calculated by the following formula.

Amorphous phase fraction (%)=(the number of measurement points at which the KAM value is 1° or more/the number of all measurement points)×100

The average KAM value of the target of the present embodiment is preferably 2° or less, more preferably 1° or less, still more preferably 0.5° or less. This reduces strain inside the target to reduce the occurrence of cracking and warpage during machining and easily reduces the cracking of a sputtering film and the generation of particles during film deposition to thereby stabilize the etching rate. The average KAM value is calculated from the arithmetic mean of the KAM values at all the measurement points.

The maximum deviation of the average crystal grain size of the target of the present embodiment in a depth direction (hereinafter also simply referred to as a "maximum deviation") is preferably 30 μm or less, more preferably 20 μm or less, or 15 μm or less. When the maximum deviation is this value, the deposition rate of a sputtering film tends to be uniform. The maximum deviation may be, for example, 1 μm or more, 2 μm or more, or 5 μm or more.

Herein, the depth direction refers to the thickness direction of the target. The maximum deviation refers to a maximum deviation among the average crystal grain sizes in a plurality of measurement segments C (described later) when the measurement portion B in the observation region A of the target is segmented into the plurality of measurement segments C.

Figure 3:
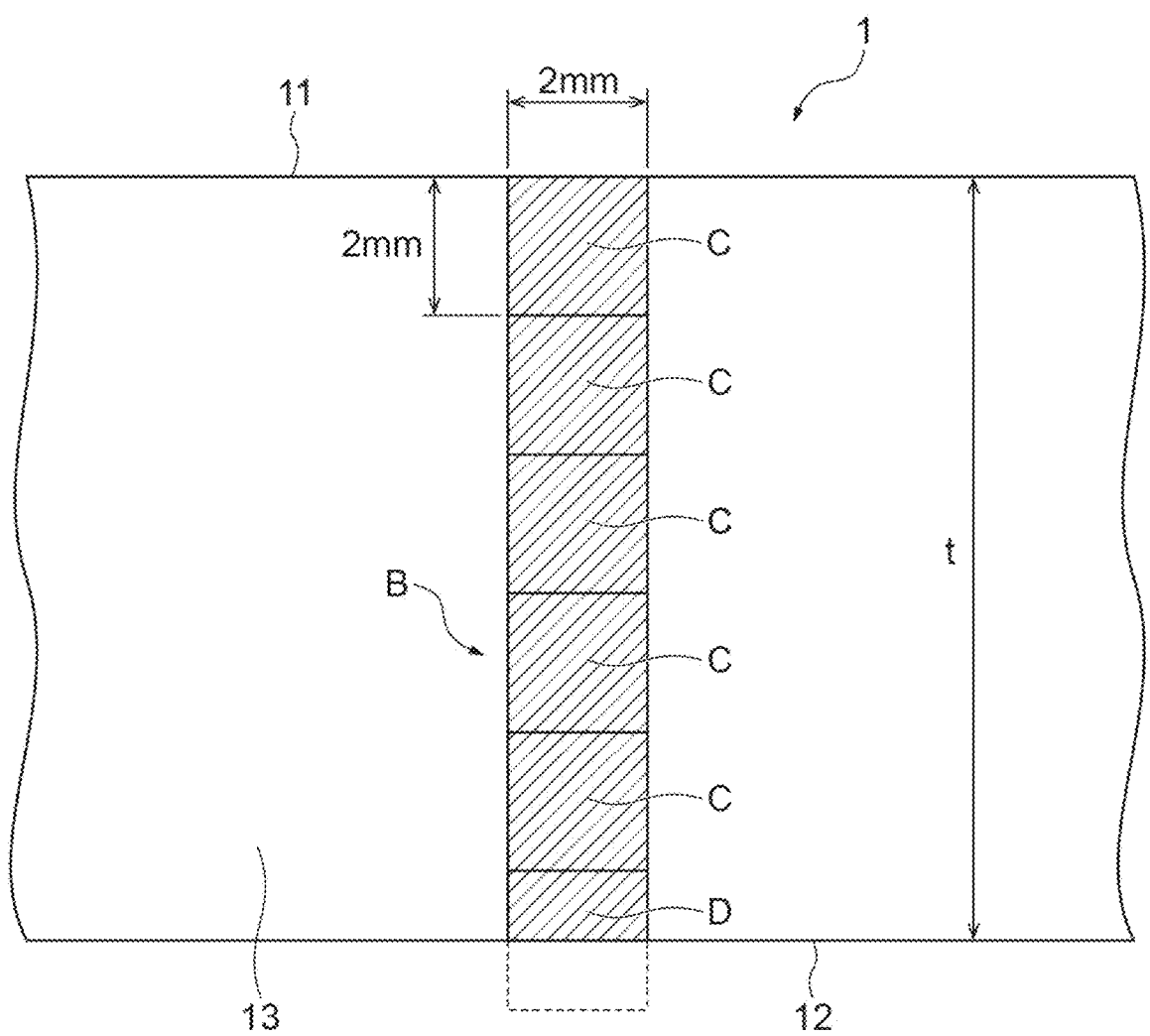
FIG. 3 is a schematic sectional view of a target for illustrating measurement segments C and a non-measurement part D.

The value of the maximum deviation is specifically measured as follows. That is, the measurement portion B is segmented into rectangles of 2 mm in width×2 mm in depth from the sputtering surface (front surface) to the bonding surface (back surface), and the rectangles are each defined as a measurement segment C. In this case, as illustrated in FIG. 3, if a region of the measurement portion B closest to the back surface has a depth of less than 2 mm, the average crystal grain size in the region (non-measurement part D) is not measured. In FIG. 3, the portion of the rectangle indicated by the dotted line illustrates a portion of a measurement segment C protruding from the back surface 12 on the assumption that the non-measurement part D is the above measurement segment C. For each of the measured measurement segments C, the average crystal grain size is calculated, and the difference between the maximum and the minimum of the average crystal grain sizes is defined as the maximum deviation.

The crystal orientation of the target of the present embodiment is preferably a random orientation. The phrase "crystal orientation is a random orientation" refers to a crystal structure in which crystals are not oriented along a specific crystal plane, and a crystal structure in which crystals are not oriented along any of the {001}, {111}, and {101} planes, and, in particular, means that the measurement portion B is measured by SEM-EBSD, and an area ratio of each of the {001}, {111}, and {101} planes in which the normal of the corresponding {001}, {111}, and {101} planes is oriented at an orientation difference of 15° or less with respect to the normal direction of the sputtering surface is 10% or more and 20% or less based on the area of the entire measurement range (measurement portion B). When the crystal orientation is a random orientation, an imbalance of the crystal orientation of a sputtering film is less likely to be generated during film deposition.

The relative density of the target of the present embodiment preferably exceeds 99.6% and is more preferably 99.7% or more, still more preferably 99.8% or more. An increase in the relative density improves the strength to facilitate the application of a high discharge power. This improves the deposition rate and tends to increase productivity of a sputtering film. The relative density is 100% or less.

The relative density of the target can be measured by the following method. Specifically, a measured density of the target is measured in accordance with JIS R 1634, and the measured density is divided by the true density to calculate the relative density. In the present embodiment, the true density of chromium may be 7.19 g/cm$^3$, and the true density of molybdenum may be 10.22 g/cm$^3$. The true density of a chromium-molybdenum alloy is determined as follows. Specifically, the masses of chromium and molybdenum are calculated from the composition of the chromium-molybdenum alloy of the target. The masses of the elements are divided by the above corresponding true densities to calculate the volumes of chromium and molybdenum in the target. The sum of the volumes of chromium and molybdenum is determined as the volume of the chromium-molybdenum alloy. The density calculated by dividing the mass of the whole chromium-molybdenum alloy by the volume of the chromium-molybdenum alloy is determined as the true density in the composition of the chromium-molybdenum alloy of the target.

The area of the sputtering surface of the target of the present embodiment is preferably 200 cm$^2$ or more, more preferably 350 cm$^2$ or more, still more preferably 800 cm$^2$ or more. An area of the sputtering surface of 200 cm$^2$ or more can increase the deposition area of a sputtering film. Accordingly, a film with a large area which usually needs to be deposited using a plurality of targets can also be deposited using a single target. Moreover, mixing of impurities from boundary portions between the targets can be suppressed. The upper limit of the area of the sputtering surface is not particularly limited; however, the area of the sputtering surface is, for example, 1,500 cm$^2$ or less, or 1,200 cm$^2$ or less. The area of the sputtering surface can be calculated, as the area of a circle, using the diameter of the sputtering surface. The diameter of the sputtering surface can be measured with a vernier caliper or a three-dimensional measuring device.

The purity of the target of the present embodiment is not particularly limited, but preferably exceeds 99.6%, and is more preferably 99.9% or more, still more preferably 99.99% or more, particularly preferably 99.995%. When the purity exceeds 99.6%, the generation of particles originating from impurities is more likely to be suppressed.

The impurity content of the target of the present embodiment can be measured by glow discharge mass spectrometry (GDMS). For example, a specimen with a size of 10 to 25 mm×10 to 25 mm×0.5 to 15 mm is cut out from the target to prepare a measurement sample. The measurement sample is pretreated by being subjected to polishing with SiC abrasive paper (#800), then ultrasonic cleaning in pure water for 10 minutes, dehydration with an alcohol, hot-air drying, and then vacuum packing. For the measurement sample after the pretreatment, the impurity content may be measured by a method according to ASTM F 1593.

<Method for Producing Sputtering Target>

Next, a method for producing a target of the present embodiment will be described.

The target of the present embodiment can be produced by a method that includes a refining step including a rolling step (plastic working step) of subjecting an ingot containing at least one metal selected from the group consisting of chromium, molybdenum, and chromium-molybdenum alloys to rolling treatment (plastic working treatment) to obtain a rolled product serving as a plastically worked product and a heat treatment step of subjecting the rolled product to heating treatment.

The ingot for the rolling step may be any ingot containing at least one metal selected from the group consisting of chromium, molybdenum, and chromium-molybdenum alloys.

The method for producing a target of the present embodiment may include, before the refining step, an ingot preparation step of sintering, or melting and then cooling at least one metal (hereinafter also referred to as a "raw material" or "raw material metal") selected from the group consisting of chromium, molybdenum, and chromium-molybdenum alloys to obtain an ingot.

In the ingot preparation step, an ingot is prepared from the raw material by a sintering method or a melting method.

The form of the raw material is not limited as long as an ingot is obtained by sintering, or melting and then cooling the raw material, and such a form may be, for example, a powdered, granular, or flaky form.

The purity of the raw material metal is preferably 99.99% or more. When the raw material is a chromium-molybdenum alloy, the content of a component other than the chromium-molybdenum alloy is preferably 0.02% by mass or less, or 0.01% by mass or less. The oxygen content of the raw material is 100 mass ppm or less, preferably 30 mass ppm or less, more preferably 20 mass ppm or less, still more preferably 10 mass ppm or less, particularly preferably 7 mass ppm or less. A reduction in the oxygen content of the raw material enables a reduction in the oxygen content of the target. The oxygen content is preferably low, but the oxygen content may be, for example, more than 0 ppm, or 1 ppm or more.

In the sintering method, an ingot is obtained by sintering the raw material. The type of sintering method may be, for example, at least one of a molding-sintering method and a pressure sintering method. Either sintering method may be used, but the pressure sintering method is preferably employed in order to improve the density. Examples of the pressure sintering method include a hot press method and a hot isostatic press method (hereinafter also referred to as a "HIP method"), and the HIP method, which has a higher pressurizing capability, is preferably used. The sintering temperature is not particularly limited, but is preferably 1,300° C. or higher and 1,500° C. or lower, more preferably 1,350° C. or higher and 1,450° C. or lower. When the sintering temperature is within the above temperature range, the density and the average crystal grain size of a sintered product before rolling treatment can be predetermined values. The sintered product obtained may be used as the ingot.

In the melting method, an ingot is obtained by melting the raw material by heating to a temperature equal to or higher than the melting point and then performing cooling. The method of melting is not particularly limited as long as the amount of oxygen becomes 100 mass ppm or less. The method of melting may be, for example, one or more selected from the group consisting of skull melting, arc melting, and EB melting, and furthermore, in order to reduce the oxygen content and impurities in the target, EB melting is preferred.

The relative density of the ingot for the rolling step is preferably 99% or more, more preferably 99.5% or more. This improves the strength of a target obtained from the ingot. The relative density of the ingot may be, for example, 100% or less.

The average crystal grain size of the ingot is preferably 50 μm or more and 400 μm or less. When the average crystal grain size is 50 μm or more, the density of the target to be obtained is improved, and the oxygen content tends to be reduced. When the average crystal grain size of the ingot is 400 μm or less, the average crystal grain size of the target to be obtained tends to be reduced, and the number of times of rolling treatment described later is decreased to thereby improve productivity.

The refining step includes a rolling step of subjecting an ingot to rolling treatment to obtain a rolled product and a heat treatment step of subjecting the rolled product to heating treatment. By subjecting the ingot to the refining step, crystal grains in the ingot are refined, and a target of the present embodiment having an average crystal grain size of 150 nm or less is provided.

The method for producing a target of the present embodiment may further include, prior to the rolling step, a plastic working step of subjecting the ingot to plastic working as pretreatment, followed by heat treatment. In other words, the method for producing a target of the present embodiment may further include, prior to the refining step, a pretreatment step of subjecting the ingot to plastic working as pretreatment, followed by heat treatment. The method of plastic working in the pretreatment step may be any method as long as the crystal microstructure of the ingot can be fractured, and examples of the method of plastic working include forging, drawing, and extrusion. Examples of forging include radial forging in which forging is performed in a direction perpendicular to the longitudinal direction of the ingot, upset forging in which forging is performed in a direction parallel to the longitudinal direction, and kneading forging in which upset forging and radial forging are combined. After plastic working, heat treatment is performed to cause recrystallization, and consequently, the ingot microstructure is reformed, and cracking is less likely to occur during rolling. The plastic working and the subsequent heat treatment are preferably performed at temperatures higher than those in the rolling step and the heat treatment step described above. As for the temperatures, the plastic working can be performed at a temperature of, for example, 900° C. or higher and 1,200° C. or lower, and the heat treatment can be performed at a temperature of, for example, 1,000° C. or higher and 1,300° C. or lower.

In the rolling step, the ingot is subjected to rolling treatment to prepare a rolled product. The resulting rolled product is further subjected to the heat treatment step to thereby refine crystal grains of the ingot, thus obtaining the target of the present embodiment. Note that, before the rolling treatment is performed, the ingot may be subjected to a grinding process to have a shape and a size suitable for rolling. The processing method may be, for example, grinding with a surface grinder.

The means for the rolling treatment is not particularly limited as long as the crystal microstructure of the ingot can be fractured, and the rolling treatment can be performed using, for example, rolling mill rolls. In rolling with rolling mill rolls, the prepared ingot is compressed by passing the ingot through a gap between a pair of rolling mill rolls, the gap having a width smaller than the thickness of the ingot. This provides a rolled product. The resulting rolled product may be repeatedly passed through a gap between a pair of rolling mill rolls. Hereinafter, a step of passing an ingot or a rolled product through a gap between a pair of rolling mill rolls is also referred to as a "rolling pass".

The rolling treatment is preferably performed while a temperature of the ingot to be rolled (hereinafter, also referred to as a "rolling temperature") is 500° C. or higher and 1,000° C. or lower. A rolling temperature of 500° C. or higher can reduce the occurrence of cracking, and a rolling temperature of 1,000° C. or lower can suppress coarsening of crystal grains due to dynamic recrystallization. The rolling temperature is more preferably 600° C. or higher and 900 or lower, still more preferably 600° C. or higher and 700° C. or lower. When the rolling temperature is within the above range, compressive strain can be left in the whole rolled sheet serving as a rolled product, and therefore, the crystal grains are likely to be refined by the subsequent heat treatment.

The rolling reduction ratio of an ingot or a rolled product in each rolling pass is preferably set so as to be 6% or more and 15% or less of the thickness of the ingot or the rolled product before the rolling pass, more preferably 8% or more and 10% or less. When the rolling reduction ratio is 6% or more, the difference in the amount of deformation between the surface and the inside of the ingot during rolling can be small to suppress an imbalance of the orientation in the depth direction after recrystallization. When the rolling reduction ratio is 15% or less, cracking of the material can be reduced. When the rolling reduction ratio is 6% or more and 15% or less, strain can be uniformly introduced to the whole without cracking of the rolled product, enabling rolling in which the amorphous phase fraction and orientation imbalance are controlled.

When a rolling pass is performed a plurality of times, the total rolling reduction ratio of an ingot is preferably 30% or more, 40% or more, or 50% or more of the thickness of the ingot before the first rolling pass. In such a case, strain can be sufficiently introduced into the rolled product, and a target having a small average crystal grain size tends to be obtained after the refining step. The total rolling reduction ratio is more preferably 90% or less, 80% or less, or 70% or less. In such a case, even when a target having a sputtering surface with a large area is produced, the thickness of the ingot provided for the plastic working step can be reduced, and the size of plastic working equipment need not to be excessively large.

The temperature difference between rolling mill rolls and the ingot is preferably 500° C. or lower, more preferably 300° C. or lower. When the difference between the roll temperature and the ingot temperature is 500° C. or lower, it is possible to reduce the occurrence of cracking caused by thermal stress due to the temperature gradient inside the ingot.

The rolled product obtained by the rolling treatment is further subjected to the heat treatment step to provide a heat-treated product in which crystal grains of the ingot are refined.

The heat treatment in the heat treatment step is performed at a temperature higher than the rolling temperature in the immediately previous rolling step. The heat treatment performed at a temperature equal to or higher than the rolling temperature can release rolling strain to recrystallize crystal grains.

The heat treatment temperature is preferably 850° C. or higher and 1,300° C. or lower, preferably 900° C. or higher and 1,100° C. or lower. This promotes recrystallization of crystal grains to refine the crystal grains of the target. When heating is performed in an air atmosphere furnace at 1,300° C. or lower, vigorous reaction between oxygen in air and a metal contained in the rolled product is less likely to occur, and a reduction in the yield due to the generation of a large amount of surface oxide tends to be less likely to occur. When heating is performed in a vacuum furnace at 1,300° C. or lower, surface oxidation can be suppressed and an increase in the average crystal grain size tends to be less likely to occur, and thus a target of the present embodiment is likely to be obtained. When the heat treatment temperature is 850° C. or higher, the microstructure after rolling is less likely to be maintained; therefore, recrystallization is likely to proceed. Through the heat treatment step described above, a heat-treated product is obtained.

The refining step may be repeatedly performed. Specifically, the heat-treated product obtained by subjecting the rolled product after the rolling step to the heat treatment step may be subjected to the rolling step and the heat treatment step again. When the refining step is repeatedly performed, the rolling temperature of the rolled product in the second and subsequent refining steps is preferably 500° C. or higher and lower than 850° C. When the heat treatment temperature is lower than 850° C., additional rolling can be performed while the strain distribution of the material is moderately maintained; therefore, strain can be uniformly provided inside the material. The temperature of a rolled product in the second and subsequent refining steps is preferably lower than the rolling temperature of an ingot or a rolled product in the immediately previous refining step. When rolling is performed at a temperature lower than that in the immediately previous refining step, strain can be further added while strain accumulated in the ingot or the rolled product in the immediately previous refining step is moderately maintained.

The surface of the heat-treated product after the refining step is preferably subjected to a surface polishing process because an oxide may be formed thereon and the surface has a large surface roughness. The processing method is not particularly limited. The processing method may be, for example, grinding with a surface grinder. In order to remove oxidized scale on the surface of the heat-treated product, a portion from the surface of the heat-treated product to a depth of 0.5 mm or more is preferably ground. In the case where the refining step is repeatedly performed, the surface polishing process may be performed for at least a heat-treated product after the last heat treatment step.

Through the above treatment, the target of the present embodiment is obtained.

The obtained target may be joined (bonded) to a backing plate for use. Examples of the joining method include diffusion bonding, solder bonding, and friction stir welding, but the joining method is not particularly limited.

In the above embodiment, a case where the plastic working step included in the refining step is a rolling step has been described; however, the method of plastic working is not limited to rolling and may be forging, drawing, and extrusion.

Examples of forging include radial forging in which forging is performed in a direction perpendicular to the longitudinal direction of an ingot, upset forging in which forging is performed in a direction parallel to the longitudinal direction, and kneading forging in which upset forging and radial forging are combined.

<Method for Producing Sputtering Film>

Figure 4:
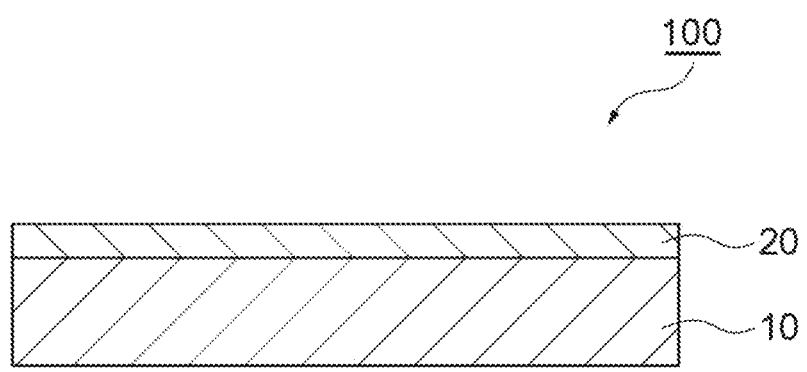
FIG. 4 is a sectional view illustrating a substrate with a sputtering film produced by a method for producing a sputtering film according to an embodiment of the present disclosure.

A method for producing a sputtering film of the present embodiment includes a step of performing sputtering using the target of the present embodiment to produce a sputtering film. That is, a sputtering film can be produced by performing sputtering using the target of the present embodiment. FIG. 4 is a sectional view illustrating a substrate with a sputtering film produced by a method for producing a sputtering film according to an embodiment of the present disclosure. As illustrated in FIG. 4, a substrate with a sputtering film 100 includes a substrate 10 and a sputtering film 20 formed on the substrate 10. Sputtering using the target of the present embodiment can suppress the generation of particles during film deposition to provide a sputtering film with high film-thickness uniformity.

Example of the substrate 10 include, but are not particularly limited to, a glass substrate and a quartz substrate.

The temperature of the substrate 10 (film deposition temperature) is not particularly limited but may be, for example, room temperature (25° C.).

The type of process gas during film deposition is not particularly limited as long as the gas causes sputtering upon discharging, and the gas may be, for example, argon.

The gas partial pressure during film deposition is not particularly limited but may be, for example, 0.2 Pa or more and 2 Pa or less.

The discharge power during film deposition is not particularly limited but may be, for example, 2.5 W/cm$^2$ or more and 50 W/cm$^2$ or less.

The film deposition time is not particularly limited but may be, for example, 10 seconds or more and 100 seconds or less.

The sputtering can be performed using a typical sputtering apparatus. The conditions for sputtering are not particularly limited, and the sputtering can be performed, for example, under the following conditions.

Ultimate vacuum: 1×10$^{-4}$ Pa
Process gas: Ar
Gas partial pressure: 0.5 Pa
Film deposition temperature: Room temperature
Substrate: Glass substrate
Discharge power: 10 W/cm$^2$
Film deposition time: 60 seconds

EXAMPLES

The contents of the present disclosure will be described in more detail with reference to Examples and Comparative Examples; however, the present disclosure is not limited to Examples below. In the following description, φ means the diameter of a circle.

Example 1

A chromium powder having a purity of 99.99% and an oxygen content of 80 mass ppm was used as a raw material, enclosed in a can made of soft iron and having a size of 350 mm×350 mm×350 mm, and subjected to HIP treatment in an argon atmosphere at 1,150° C. and 100 MPa for two hours. Subsequently, the resulting product was taken out from the can and subjected to a cutting and grinding process to prepare a disk-shaped ingot (§ 180 mm×50 mm in thickness).

Furthermore, the ingot was heated in advance to a rolling temperature in an electric furnace, and rolling treatment (hereinafter also referred to as "primary rolling treatment", and a rolling temperature at this time is also referred to as a "primary rolling temperature") was conducted using a rolling mill with the following specifications.

(Specifications of Rolling Mill)
Roll material: SUJ-2
Roll diameter: φ 350 mm
Pressurizing capability during rolling: 250 ton
Rolling temperature: 600° C.
Roll speed: 15 m/min
Number of times of passes (the number of times of passing through rolling treatment): 16 times
Maximum amount of change in distance between rolls per one rolling pass: 0.5 mm
Heating atmosphere: In air After the rolling treatment, heat treatment (hereinafter also referred to as "primary heat treatment", and a heat treatment temperature at this time is also referred to as a "primary heat treatment temperature") was conducted in air at a heat treatment temperature of 900° C. for one hour to obtain a disk-shaped rolled product (hereinafter also referred to as a "primary rolled product"), and this was used as a target of this Example.

Example 2

A disk-shaped primary rolled product was prepared as in Example 1 except that the oxygen content in the raw material was the value shown in Table 1, and the treatment was conducted under the conditions of the production process shown in Table 1.

For the obtained primary rolled product, rolling treatment (hereinafter also referred to as "secondary rolling treatment", and a rolling temperature at this time is also referred to as a "secondary rolling temperature") was conducted under the conditions shown in Table 1, heat treatment (hereinafter also referred to as "secondary heat treatment", and a heat treatment temperature at this time is also referred to as a "secondary heat treatment temperature") was then conducted to obtain a disk-shaped secondary rolled product, and this was used as a target of this Example.

Examples 3 to 10

Targets of Examples 3 to 10 were each prepared as in Example 2 except that the oxygen content in the raw material was the value shown in Table 1, and the refining steps (1st and 2nd times) were conducted under the conditions shown in Table 1.

Comparative Examples 1 and 2

Targets of Comparative Examples 1 and 2 were each prepared as in Example 1 except that the oxygen content in the raw material was the value shown in Table 1, and the refining step (1st time) was conducted under the conditions shown in Table 1.

<Evaluations of Target>

(Scanning Electron Microscope-Electron Backscatter Diffraction)

Figure 5:
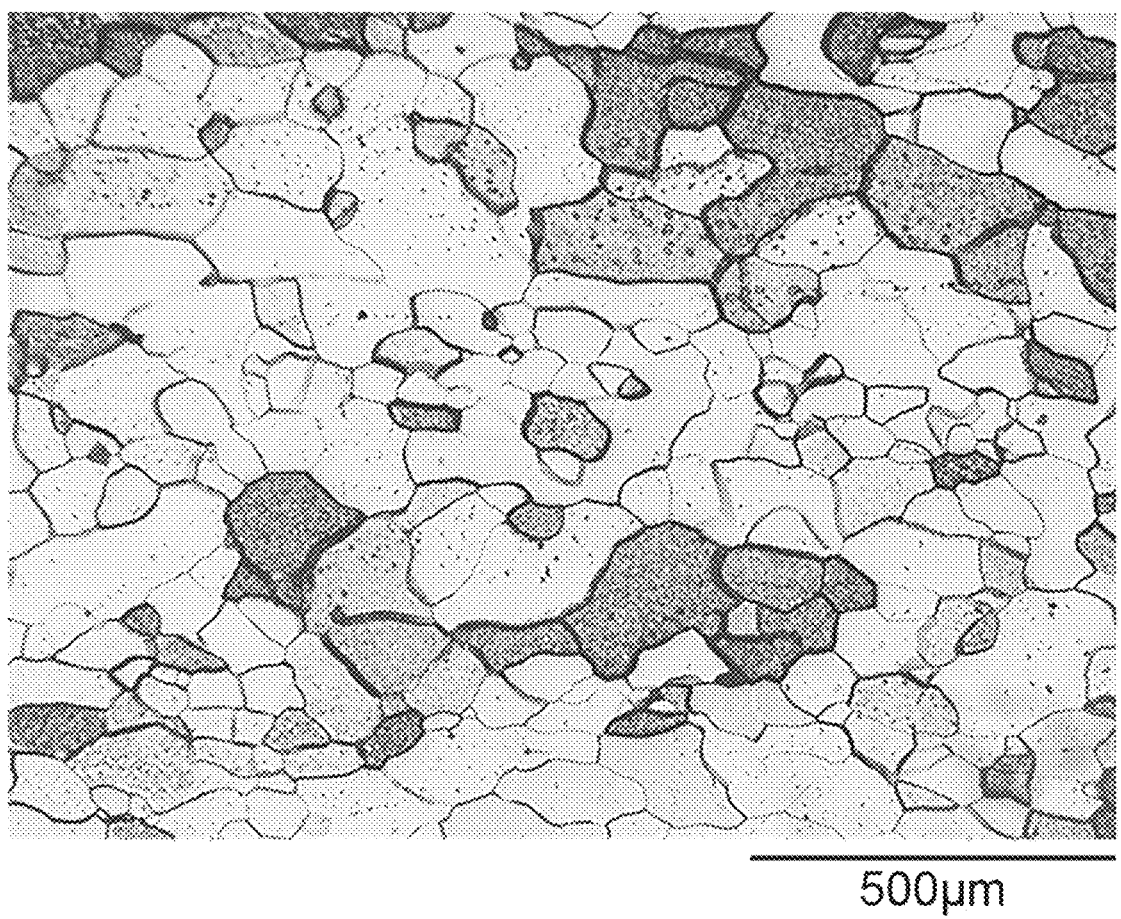
FIG. 5 is a view showing a SEM observation image (magnification: 200 times) of a cross section of a target of Example 1.

Scanning electron microscope-electron backscatter diffraction (SEM-EBSD) was conducted by observing a cross-sectional portion determined as follows: The value of the radius R (cm) of a circular sputtering surface of a disk-shaped target was the value listed in Table 2, and a width of 2 mm was taken from a position at a distance of 0.7R from the center of the circle toward the inner side in the radial direction. The cross-sectional portion extending in the direction perpendicular to the sputtering surface and having a size of 2 mm in width×t (mm) in overall thickness of the target was observed. The measurement pretreatment, measurement region (hereinafter also referred to as a "SEM-EBSD observation range") corresponding to the measurement portion B of FIG. 3, measurement conditions, and programs used for SEM-EBSD are described below. FIG. 5 shows a SEM observation image in a measurement segment C closest to the front surface in the measurement portion B of the cross section of the target of Example 1.

Measurement Pretreatment

Mirror-polishing with SiC abrasive paper and by buffing, followed by electrolytic etching with a 5 vol % aqueous solution of sulfuric acid Measurement Region (Measurement Portion B)

Length in direction parallel to sputtering surface (width): 2 mm

Length in direction perpendicular to sputtering surface (thickness): Overall thickness t=9 mm Measurement Conditions Apparatus name: JSM-IT800 (manufactured by JEOL Ltd.)

Beam conditions: Accelerating voltage 20 kV, Illumination current 100 μA

Work distance: 10 mm

Step width: 5 μm

Programs Used

Measurement program: AZtec

Analysis program: AZtec Crystal (Measurement of Amorphous Phase Fraction)

The KAM (Kernel Average Misorientation) values were measured at all measurement points within the above observation range, and the number of measurement points at which the KAM value was 1° or more was divided by the number of all measurement points to calculate the amorphous phase fraction (content of the amorphous phase). The results are shown in Table 2.

Amorphous phase fraction (%)=the number of measurement points at which the KAM value is 1° or more/the number of all measurement points (Oxygen Content)

The oxygen content of the target was measured with an oxygen/nitrogen analyzer (apparatus name: ON736, manufactured by LECO Corporation). In this measurement, a prism-shaped sample (0.58 g) with a size of 4 mm×4 mm×5 mm cut out from the target by cutting was used as a measuring object. The results are shown in Table 2.

(Measurement of Average Crystal Grain Size)

The average crystal grain size of crystal grains of the target was calculated from the average line segment length per one crystal grain of a line segment crossing crystal grains in the ingot microstructure in accordance with the intercept method of JIS G 0551:2013. The average crystal grain size (μm) was calculated for all the crystal grains within the above observation range. The results are shown in Table 2.

(Measurement of Variation in Average Crystal Grain Size)

The rectangular SEM-EBSD observation range was segmented into a plurality of continuous rectangular regions of 2 mm in width×2 mm in depth from the sputtering surface (front surface) to the bonding surface (back surface), and the average crystal grain size was calculated for each of the regions. At this time, in the region (non-measurement part D) located closest to the back surface, the length of the measurement portion B from a side of the adjacent measurement segment C, the side being located closer to the back surface, to the back surface was less than 2 mm, and any more rectangular measurement segment C with a size of 2 mm in width×2 mm in depth could not be secured on the measurement portion B. Therefore, for the region (non-measurement part D) located closest to the back surface, the average crystal grain size was not measured. The difference between the maximum and minimum of the average crystal grain sizes was determined as the maximum deviation (μm) and evaluated as a variation in the average crystal grain size. The results are shown in Table 2.

(Measurement of Density)

The density of the target was measured in accordance with JIS R 1634 (Test methods of test methods for density and apparent porosity of fine ceramics), and the relative density (%) was calculated on the assumption that the true density of chromium is 7.19 g/cm$^3$. The results are shown in Table 2.

(Orientation)

The orientation was evaluated on the basis of an orientation area ratio calculated as a ratio of an area of each of the {001}, {111}, and {101} planes whose normal is oriented at an orientation difference of 15° or less with respect to the normal direction of the sputtering surface to the whole area of the observation range. The evaluation criteria of the orientation were as follows. The results are shown in Table 2.

"A" . . . . The orientation area ratio in each of the {001}, {111}, and {101} planes is 10% or more and 20% or less (that is, the orientation is a random orientation).

"B" . . . . The orientation area ratio in at least one of the {001}, {111}, and {101} planes is less than 10% or more than 20% (that is, the orientation is a non-random orientation).

(Average KAM Value)

The arithmetic mean value of the KAM values at all the measurement points in the measurement of the amorphous phase fraction was calculated, and this arithmetic mean value was used as the average KAM value of the target of each Example or Comparative Example. The results are shown in Table 2.

(Average Aspect Ratio)

The average aspect ratio was calculated as follows. Specifically, in the above observation range, for all crystal grains that could be observed, numerical values of the long axis/short axis determined when the crystal grains were each approximated by an ellipse were calculated, and the average of these numerical values was determined as the average aspect ratio. The results are shown in Table 2.

(Area of Sputtering Surface)

The area of the sputtering surface was determined by measuring the diameter 2R of the sputtering surface with a vernier caliper to calculate the radius R, and using the following formula. The results are shown in Table 2.

Area of sputtering surface=$\pi \times R^2$

TABLE 1

| | Production process | | | | | | | | | | | | |
|---|---|---|---|---|---|---|---|---|---|---|---|---|---|
| | Refining step (1st time) | | | | | | Refining step (2nd time) | | | | | | |
| | Primary rolling treatment | | | | | Primary heat treatment | | Secondary rolling treatment | | | | Secondary heat treatment | |
| | Raw material Oxygen content (mass ppm) | Primary rolling temperature (° C.) | Number of passes (times) | Roll speed (m/min) | Rolling reduction ratio (%) | Primary heat treatment temperature (° C.) | Time (min) | Secondary rolling temperature (° C.) | Number of passes (times) | Roll speed (m/min) | Rolling reduction ratio (%) | Secondary heat treatment temperature (° C.) | Time (min) | Occurrence of cracking |
| Example 1 | 78 | 600 | 24 | 15 | 70 | 900 | 60 | — | — | — | — | — | — | No |
| Example 2 | 30 | 700 | 12 | 15 | 60 | 800 | 60 | 600 | 4 | 5 | 25 | 900 | 60 | No |
| Example 3 | 30 | 700 | 12 | 15 | 60 | 800 | 60 | 600 | 4 | 5 | 25 | 1000 | 60 | No |
| Example 4 | 43 | 800 | 12 | 15 | 60 | 800 | 60 | 600 | 4 | 5 | 25 | 900 | 60 | No |
| Example 5 | 43 | 800 | 12 | 15 | 60 | 850 | 60 | 800 | 8 | 5 | 25 | 900 | 60 | No |
| Example 6 | 43 | 800 | 32 | 15 | 60 | 850 | 60 | 800 | 16 | 5 | 25 | 900 | 60 | No |
| Example 7 | 12 | 700 | 12 | 15 | 60 | 800 | 60 | 600 | 4 | 5 | 25 | 900 | 60 | No |
| Example 8 | 12 | 600 | 12 | 15 | 60 | 800 | 60 | 600 | 4 | 5 | 33 | 1000 | 60 | No |
| Example 9 | 13 | 600 | 8 | 15 | 50 | 800 | 60 | 600 | 4 | 5 | 40 | 1000 | 60 | No |
| Example 10 | 140 | 600 | 16 | 15 | 60 | 800 | 60 | 600 | 4 | 5 | 33 | 900 | 60 | No |
| Comparative Example 1 | 30 | 900 | 16 | 15 | 70 | 1000 | 60 | — | — | — | — | — | — | No |
| Comparative Example 2 | 125 | 600 | 4 | 15 | 25 | 900 | 60 | — | — | — | — | — | — | No |

TABLE 2

| | Target properties | | | | | | | | | | | | |
|---|---|---|---|---|---|---|---|---|---|---|---|---|---|
| | Content of amorphous phase (vol %) | Oxygen content (mass ppm) | Average crystal grain size (μm) | Average crystal grain size maximum deviation (μm) | Relative density (%) | Orientation area ratio (%) {001} | {101} | {111} | Orientation evaluation | Average KAM value (°) | Average aspect ratio | Area of sputtering surface (cm²) | Radius R of sputtering surface (cm) |
| Example 1 | 0.3 | 75 | 76 | 12.1 | 100 | 23.1 | 10.1 | 10.3 | B | 0.35 | 1.8 | 211 | 8.2 |
| Example 2 | 0.2 | 28 | 84 | 5.1 | 99.8 | 18.8 | 12 | 14 | A | 0.27 | 1.4 | 366 | 10.8 |
| Example 3 | 0.2 | 31 | 117 | 15.1 | 100 | 19.0 | 10.5 | 11.3 | A | 0.22 | 1.5 | 366 | 10.8 |
| Example 4 | 0.3 | 43 | 87 | 7.0 | 99.9 | 15.9 | 12.9 | 13.9 | A | 0.27 | 1.5 | 366 | 10.8 |
| Example 5 | 0.5 | 42 | 98 | 20.9 | 100 | 17.3 | 10.9 | 12.8 | A | 0.5 | 1.6 | 697 | 14.9 |
| Example 6 | 0.3 | 40 | 92 | 23.7 | 100 | 21.4 | 15.7 | 7.8 | B | 0.4 | 1.4 | 697 | 14.9 |
| Example 7 | 0.3 | 12 | 90 | 6 | 99.9 | 20.2 | 11.8 | 12.6 | A | 0.25 | 1.4 | 366 | 10.8 |
| Example 8 | 0.4 | 13 | 31.3 | 3.2 | 100 | 16 | 9.17 | 27.7 | B | 0.22 | 1.96 | 366 | 10.8 |
| Example 9 | 0.5 | 13 | 37.1 | 9.7 | 100 | 14.7 | 10.9 | 19.8 | A | 0.18 | 1.91 | 366 | 10.8 |
| Example 10 | 0.7 | 140 | 44.6 | 2.3 | 100 | 13.4 | 7.71 | 34.4 | B | 0.29 | 1.85 | 211 | 8.2 |
| Comparative Example 1 | 36.9 | 31 | 157 | 14.1 | 100 | 22.6 | 13.6 | 8.9 | B | 1 | 2.3 | 366 | 10.8 |
| Comparative Example 2 | 93 | 125 | 254 | 33.3 | 99.7 | 20.1 | 6.8 | 35.1 | B | 2.3 | 2.4 | 165 | 7.2 |

In Table 1, "-" indicates that the treatment is not performed. The targets of Examples in which the refining step of the ingot was conducted under the conditions shown in Table 1 were confirmed to have an amorphous phase fraction of 3% by volume or less. In addition, as shown in FIG. 5, the crystal grains of the target were confirmed to have a fine, rounded shape. Note that, in FIG. 5, the linear portions are crystal grain boundaries, and portions surrounded by the linear portions are crystal grains.

REFERENCE SIGNS LIST 1 sputtering target
11 sputtering surface
12 bonding surface
13 cross section
20 sputtering film
A observation region
B measurement portion
C measurement segment
D non-measurement part

The invention claimed is:
1. A sputtering target of chromium, molybdenum, or chromium molybdenum alloys, wherein the sputtering target comprises crystal grains, the sputtering target has a content of an amorphous phase of 3% by volume or less, and a combined concentration of chromium and molybdenum of the sputtering target exceeds 99.6%.

2. The sputtering target according to claim 1, wherein an oxygen content is 100 mass ppm or less, and an average crystal grain size of the crystal grains is 150 μm or less.

3. The sputtering target according to claim 2, wherein a maximum deviation of the average crystal grain size of the crystal grains in a depth direction is 30 μm or less.

4. The sputtering target according to claim 1, wherein a crystal orientation of the crystal grains is a random orientation.

5. The sputtering target according to claim 1, wherein a sputtering surface has an area of 200 cm2 or more.

6. The sputtering target according to claim 1, wherein an average KAM value is 2° or less.

7. The sputtering target according to claim 1, wherein a relative density exceeds 99.6%.

8. The sputtering target according to claim 1, wherein the crystal grains have an average aspect ratio of 1 or more and 1.8 or less.

9. A method for producing a sputtering film, the method comprising performing sputtering using the sputtering target according to claim 1 to produce a sputtering film.

10. A method for producing the sputtering target according to claim 1, the method comprising:
a refining step including a plastic working step of subjecting an ingot containing at least one metal selected from the group consisting of chromium, molybdenum, and chromium-molybdenum alloys to plastic working treatment to obtain a plastically worked product and a heat treatment step of subjecting the plastically worked product to heating treatment.

11. The method for producing the sputtering target according to claim 10, wherein the refining step is repeated.

12. The sputtering target according to claim 1, wherein the combined concentration of chromium and molybdenum is 99.9% or more.

13. The sputtering target according to claim 1, wherein the combined concentration of chromium and molybdenum is 99.99% or more.

14. The sputtering target according to claim 1, wherein the sputtering target has the content of the amorphous phase of 0.5% by volume or less.

15. The sputtering target according to claim 1, wherein the sputtering target has the content of the amorphous phase of 0.1% by volume or more.

16. The sputtering target according to claim 1, wherein the sputtering target has the content of the amorphous phase of 0.01% by volume or more.

* * * * *